(12) United States Patent
Sasada et al.

(10) Patent No.: US 7,030,418 B2
(45) Date of Patent: Apr. 18, 2006

(54) STRUCTURE OF CHIP CARRIER FOR SEMICONDUCTOR OPTICAL DEVICE, OPTICAL MODULE, AND OPTICAL TRANSMITTER AND RECEIVER

(75) Inventors: Noriko Sasada, Yokohama (JP); Kazuhiko Naoe, Yokohama (JP); Masataka Shirai, Higashimurayama (JP); Hideo Arimoto, Kokubunji (JP); Satoshi Tada, Chigasaki (JP)

(73) Assignee: OpNext Japan, Inc., Yokohama (JP)

( * ) Notice: Subject to any disclaimer, the term of this patent is extended or adjusted under 35 U.S.C. 154(b) by 0 days.

(21) Appl. No.: 10/808,393

(22) Filed: Mar. 25, 2004

(65) Prior Publication Data

US 2005/0139843 A1 Jun. 30, 2005

(30) Foreign Application Priority Data

Dec. 26, 2003 (JP) ............................. 2003-432013

(51) Int. Cl.
*G02B 6/36* (2006.01)

(52) U.S. Cl. .................... 257/81; 257/77; 257/763; 257/764; 385/14; 385/88

(58) Field of Classification Search ................. 257/77, 257/81, 763, 764; 385/14, 88, 91, 92
See application file for complete search history.

(56) References Cited

U.S. PATENT DOCUMENTS

| 4,854,659 A * | 8/1989 | Hamerslag et al. ........... 385/14 |
| 6,645,783 B1* | 11/2003 | Brunner et al. ............... 438/26 |
| 2002/0158257 A1* | 10/2002 | Nei .............................. 257/79 |

FOREIGN PATENT DOCUMENTS

JP 10-275957 10/1998

* cited by examiner

*Primary Examiner*—Minhloan Tran
*Assistant Examiner*—Thomas L. Dickey
(74) *Attorney, Agent, or Firm*—Antonelli, Terry, Stout and Kraus, LLP.

(57) ABSTRACT

A chip carrier includes a metal-coated portion formed on a front surface of a substrate and to be mounted a device, and a rear surface of the substrate being coated with a metal, in which a metal-coated portion is formed on a side surface of the substrate and the metal-coated portion on the front surface of substrate is connected with the metal-coated portion on the rear surface by the metal-coated portion formed on the side surface of the substrate, thereby maintaining frequency characteristics of the optical semiconductor device.

4 Claims, 6 Drawing Sheets

PLAN VIEW

SIDE VIEW

STRUCTURE OF CHIP CARRIER FOR SEMICONDUCTOR OPTICAL DEVICE, OPTICAL MODULE, AND OPTICAL TRANSMITTER AND RECEIVER

This application relates to Japanese Patent Application No. 2003-432013 filed on Dec. 26, 2003, the entire disclosure of which is incorporated herein by reference.

BACKGROUND OF THE INVENTION

1. Field of the Invention

The present invention relates to a chip carrier incorporating an optical semiconductor device or the like mounted thereon, an optical module using this chip carrier, and an optical transceiver.

2. Description of the Related Art

In general, an optical module is formed by incorporating a chip carrier on which an optical semiconductor device or the like such as a semiconductor laser diode (hereinafter, referred to as an LD) is mounted by soldering those onto a package including a power supply terminal, an input signal terminal, a ground terminal, an optical output fiber connector terminal and the like. As the chip carrier, there is used a dielectric material or a semiconductor substrate. The optical semiconductor device is mounted on a ground metal-coated portion, by soldering, formed on the surface of the dielectric material or semiconductor substrate, and the optical semiconductor device is then connected with a high-frequency transmission line or the like formed on the same substrate surface through wire-bonding.

With increase of operating speed in relation to the optical semiconductor device in recent years, excellent high-frequency characteristics have also been demanded with respect to the chip carrier. As a structural example of the chip carrier aiming at an improvement in the high-frequency characteristics, JP-A-10-275957 discloses a structure in which a conductive substrate having an optical semiconductor device mounted thereon is incorporated with a dielectric material or a semiconductor substrate having a high-frequency transmission line and a terminating resistor arranged thereon.

In an ordinary chip carrier using only a dielectric material or a semiconductor substrate, excellent characteristics are hard to be obtained in a high-frequency domain of 20 GHz or above.

Further, in such a chip carrier in which the conductive substrate and high-frequency transmission substrate are separately provided as disclosed in JP-A-10-275957, although high-frequency characteristics are relatively good, there is a problem that its manufacturing cost is high because of its structure, and a packaging process requires much time.

SUMMARY OF THE INVENTION

It is an object of the present invention to provide a chip carrier that is superior in the high-frequency characteristics and has a low cost, an optical module incorporating this chip carrier assembled therein, and an optical transceiver.

To achieve this object, reduction of an inductance on the chip carrier is a dominant means. That is, a high-frequency transmission line and a ground metal-coated portion are arranged on a dielectric material or a semiconductor substrate, a rear surface of which is coated with a metal; the metal-coated portion on the front surface are electrically connected with the metal-coated portion on the rear surface through a metallic via-hole; a part or all of a side surface of the chip carrier is coated with a metal; and the metal-coated portion on the front surface of the dielectric material or the semiconductor substrate is electrically connected with the metal-coated portion on the rear surface.

Furthermore, as another means for reducing an inductance of the chip carrier, the reduction of distance between the optical semiconductor device mounted on the chip carrier and the via-hole of the chip carrier is also prevailing means. In the present invention, when distance between the positions of the optical semiconductor device and the via-hole is relatively close in minimum, that is, the via-hole is arranged directly below the optical semiconductor device.

Thereby, using the chip carrier according to the present invention does not deteriorate the frequency characteristics of optical semiconductor device operating at a high speed. Furthermore, the chip carrier in low cost, an optical module incorporating the chip carrier and an optical transceiver are realized.

Other objects, features and advantages of the invention will become apparent from the following description of the embodiments of the invention taken in conjunction with the accompanying drawings.

DETAILED DESCRIPTION OF THE EMBODIMENTS

Embodiments according to the present invention will be described in detail hereinafter.

Embodiment 1

Figure 1A:
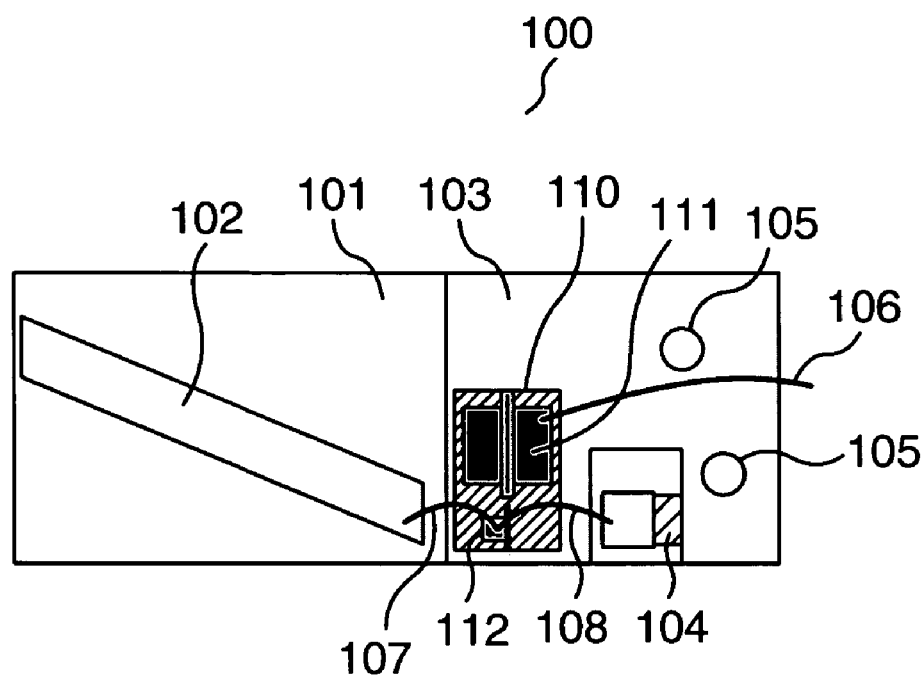
FIGS. 1A and 1B are plane and side views illustrating a chip carrier structure according to the present invention.
Figure 1B:
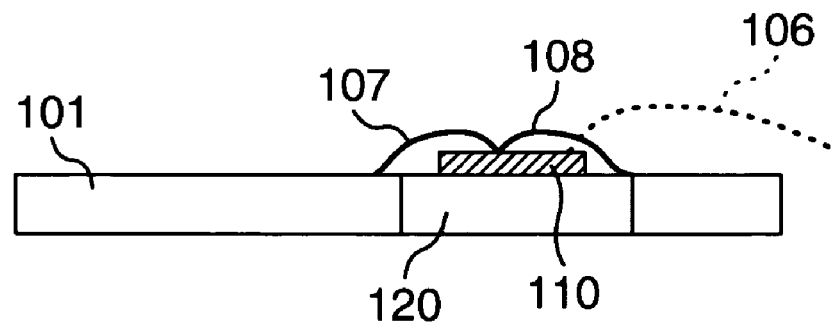

FIGS. 1A and 1B show an upper surface and a side surface of a chip carrier 100 in a first embodiment according to the present invention. The chip carrier 100 uses a substrate 101 comprising a dielectric material such as alumina (AlN) or a semiconductor formed of silicon (Si). The following elements are then formed on the substrate: a high-frequency transmission line 102; a ground metal-coated portion 103 on which an optical semiconductor device is mounted; and a terminating resistor 104. The optical semiconductor device 110 is soldered on the ground metal-coated portion 103. In this embodiment, a description will be given on the assumption that an external modulator integrated laser incorporating a semiconductor laser 111 and an external modulator 112 is used as the optical semiconductor device 110.

In this embodiment, the high-frequency transmission line 102 is a micro-strip line, and the ground metal-coated portion 103 is electrically connected with a metal-coated portion on a rear surface through a via-hole 105.

It is noted that reference numeral 106 denotes a lead wire connected to a direct-current power source; 107, a lead wire connected the micro-strip line with the external modulator 112; and 108, a lead wire connecting the external modulator 112 with a high-frequency line connected to the terminating resistor 104.

Figure 4:
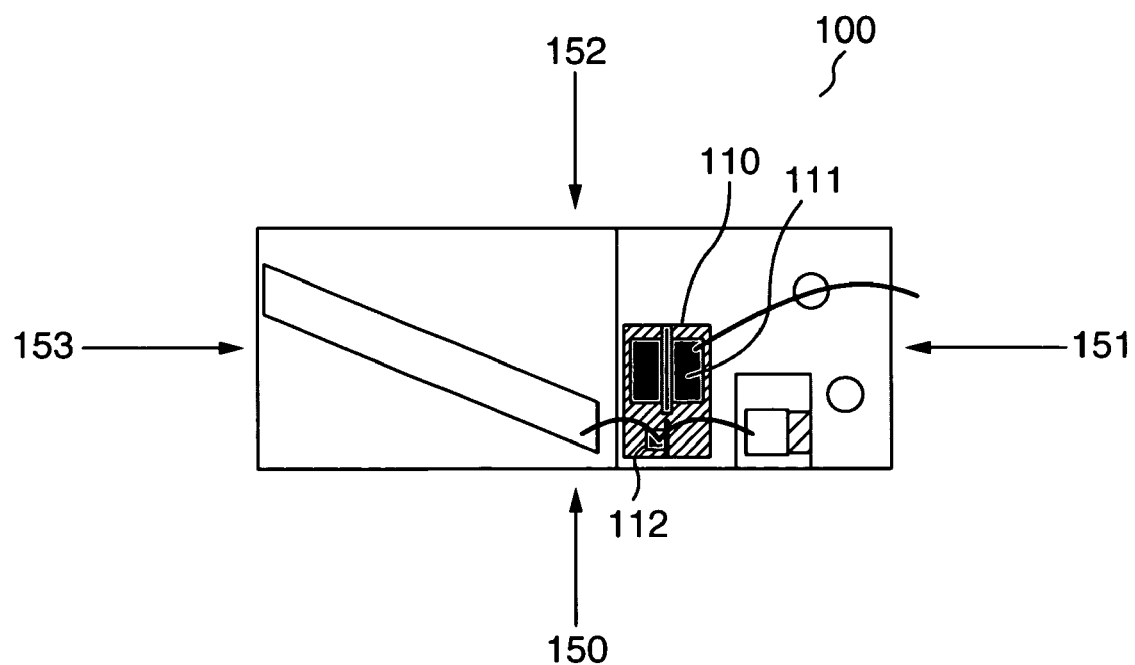
FIG. 4 is a plane view illustrating a chip carrier structure according to the present invention.

In the present invention, a part (120) or all side surfaces of the substrate 101 is coated with a metal, and a metal-coated portion 103 on the front surface of the substrate is electrically connected with a metal-coated portion on the rear surface of the same in order to enhance the ground. It is noted that coating with a metal on a side surface 150 placed at a position closest to a modulator 112 directly concerning a high-frequency operation is most effective, among four side surfaces 150 to 153 of such a chip carrier as shown in FIG. 4.

Figure 2A:
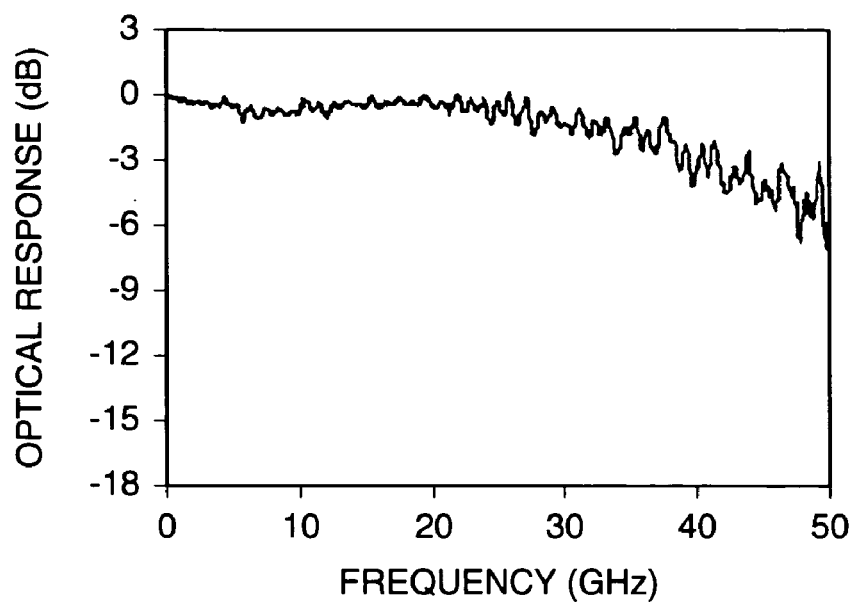
FIGS. 2A and 2B are diagrams illustrating characteristics obtained by the chip carrier according to the present invention.
Figure 2B:
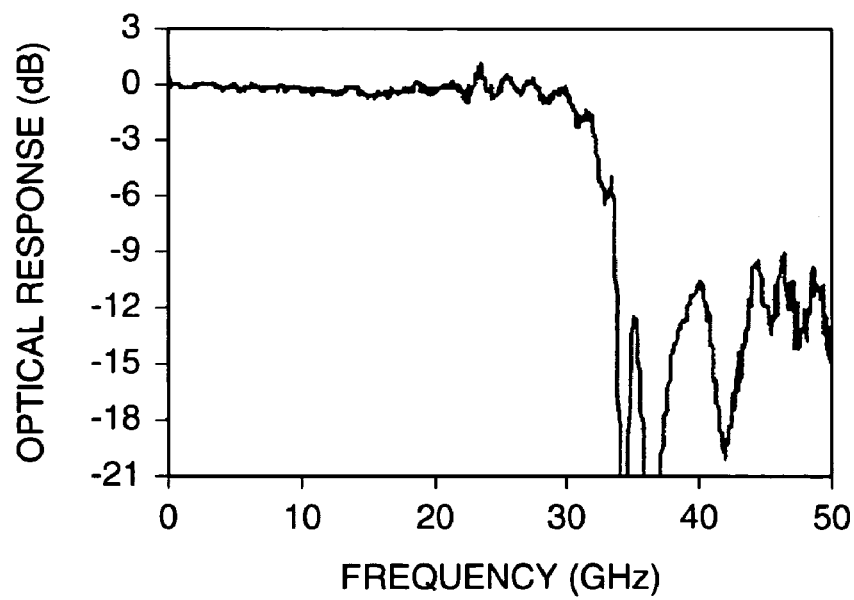

In order to confirm an effect of the present invention, FIG. 2A shows optical response characteristics obtained by an actual device mounted on the chip carrier (in a case where the side surface 150 is entirely coated with a metal) according to this embodiment. It is noted that the optical response means a ratio of an output light intensity relative to a high-frequency signal intensity input to the modulator. For the purpose of comparison, FIG. 2B shows characteristics obtained when the side surface is not coated with a metal.

When the side surface is not coated with a metal (FIG. 2B), the characteristics are abruptly deteriorated in the vicinity of 35 GHz, and a resonance is also produced. On the contrary, when the side surface 150 is entirely coated with a metal (FIG. 2A), an abrupt deterioration in the characteristics and the resonance do not occur, and the optical response of −3 dB is obtained even in the vicinity of 40 GHz, realizing the excellent high-frequency characteristics.

Figure 3:
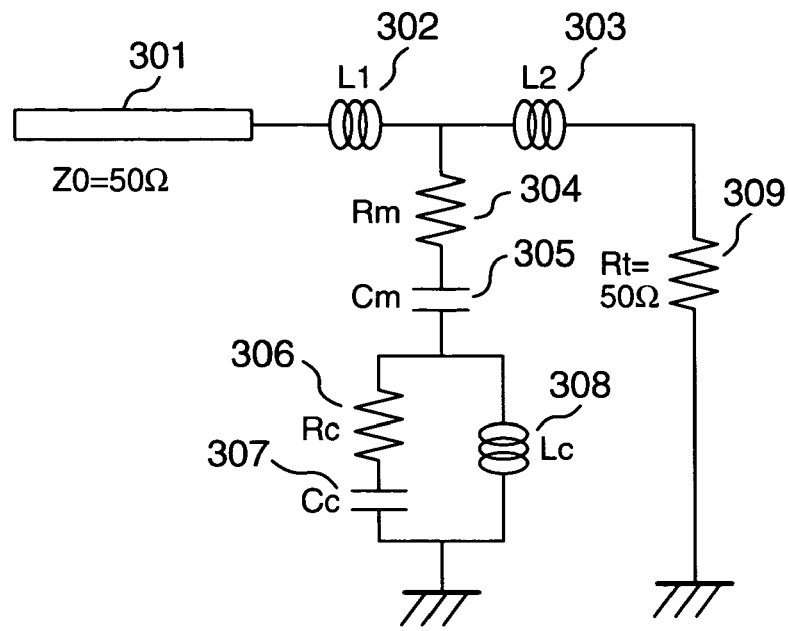
FIG. 3 is a diagram showing an equivalent circuit of the chip carrier according to the present invention.

FIG. 3 shows an equivalent circuit when the external modulation type laser is mounted on the chip carrier. Here, reference numeral 301 denotes a characteristics impedance of the high-frequency transmission line 102, i.e., 50 Ω; 309, a resistance Rt of the terminating resistor 104, i.e., 50 Ω; 302, an inductance L1 of a bonding wire 108; 303, an inductance L2 of a bonding wire 109; 304, an internal resistance Rm of the modulator 112; 305, a parasite capacitance Cm of the modulator 112; 306, a resistance Rc of the chip carrier 100; 307, a capacitance Cc of the chip carrier 100; and 308, an inductance Lc of the chip carrier 100.

It is noted that a laser 111 of the external modulator integrated laser is of a direct-current drive type, and the equivalent circuit of the laser portion can be ignored in analysis of the high-frequency characteristics. Therefore, FIG. 3 shows only the modulator portion in the equivalent circuit.

The abrupt deterioration in characteristics or the resonance in the vicinity of 35 GHz observed in FIG. 2B is caused by a series resonance due to the parasite capacitance Cm of the modulator 112 and the inductance Lc of the chip carrier 100. Here, a resonance frequency fr is given by the following expression.

$$fr = \frac{1}{2\pi\sqrt{Lc \cdot Cm}}$$

In order to improve the characteristics by shifting this series resonance frequency to the high-frequency side, the parasite capacitance Cm of the modulator must be reduced or the inductance Lc of the chip carrier must be decreased. However, the capacitance reduction of the modulator may possibly occur deterioration in device characteristics such as a drop in an extinction ratio that is a ratio of ON/OFF of light beams. Therefore, it can be considered that the inductance reduction of the chip carrier is dominant means.

In the structure of FIG. 1, the inductance Lc of the chip carrier is reduced by coating with the metal on the side surface of the chip carrier and enhancing the ground, sufficiently increasing the series resonance frequency. For this reason, it can be considered that the excellent optical response characteristics is obtained without such an abrupt deterioration in characteristics or a resonance as shown in FIG. 2A.

Figure 5:
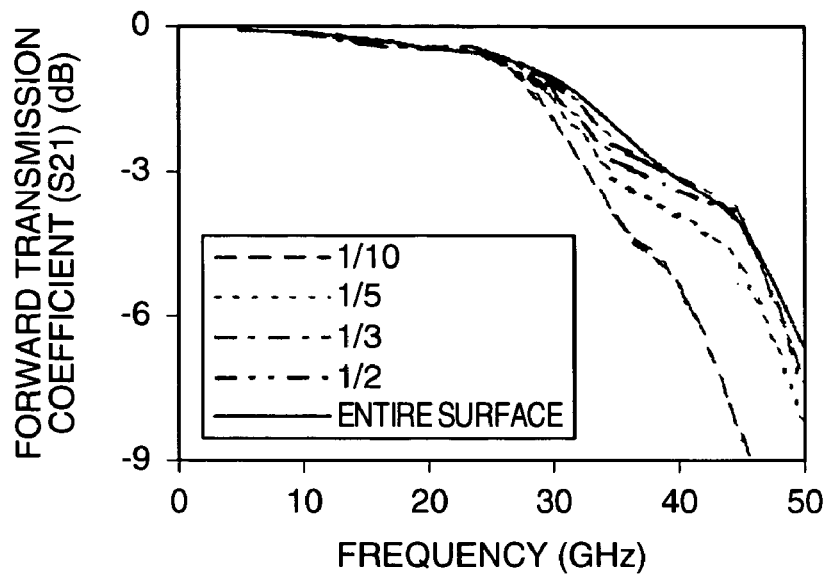
FIG. 5 is a diagram illustrating characteristics obtained by the chip carrier according to the present invention.

It is noted that the characteristics differs depending on the area of the side surface coated with the metal. FIG. 5 shows a simulation result of frequency characteristics (transmission characteristics) when 1/10, 1/5, 1/3, 1/2 and all of a superficial content of the side surface 150 is coated in cases where the side surface 150 of the chip carrier which is closest to the modulator portion 121 is coated with a metal.

It can be understood from the simulation result of FIG. 5 that the frequency characteristics are improved by increasing a metal-coated area. In particular, in a domain of 40 GHz or above, it can be revealed that the characteristics substantially equivalent to those, when the entire surface is coated with a metal, can be obtained by setting the metal-coated area to 1/3 or above.

Figure 6:
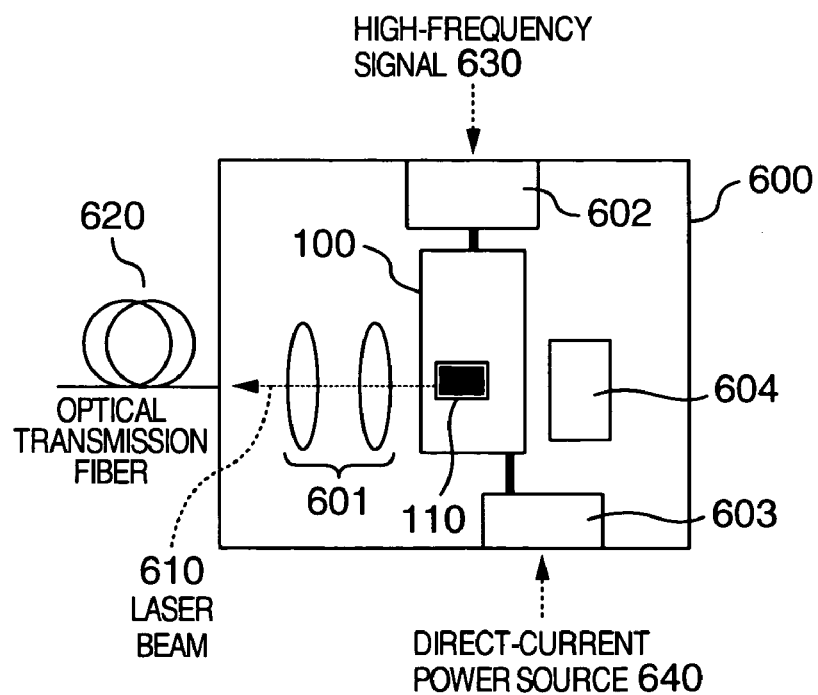
FIG. 6 is a diagram illustrating an LD module structure according to the present invention.

FIG. 6 is a structural diagram of an LD module 600 incorporating the chip carrier according to this embodiment. A high-frequency signal 630 is supplied from the outside to the optical semiconductor device 110 on the chip carrier 100 through a relay substrate 602. Likewise, a direct-current power 640 for driving the optical semiconductor device 110 is supplied through a relay substrate 603. Laser beams 610 from the optical semiconductor device 110 are condensed by a condenser lens 601, and transmitted to an optical transmission fiber 620 connected to the outside. Moreover, in order to monitor an optical output state of the optical semiconductor device 110, a monitor photodiode 604 is mounted.

Figure 7:
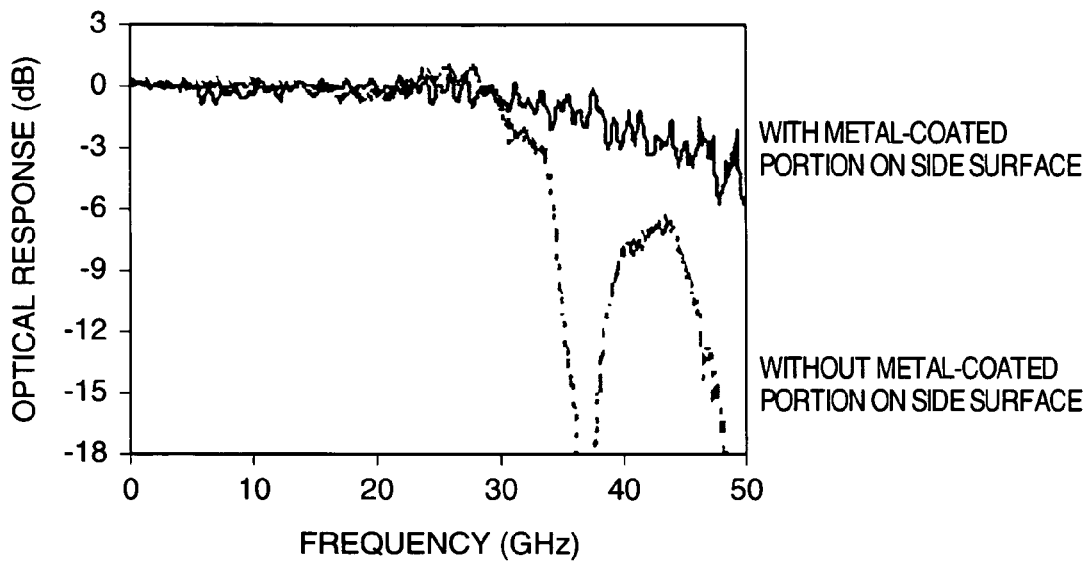
FIG. 7 is a diagram illustrating characteristics obtained by the LD module according to the present invention.

FIG. 7 shows optical response characteristics obtained from an actual device when the side surface of chip carrier 100 is coated with a metal in the LD module depicted in FIG. 6. It is noted that the side surface of the optical semiconductor device 110 closest to the modulator 112 is entirely coated with a metal. For a purpose of comparison, optical response characteristics of the LD module incorporating a chip carrier, the side surface of which is not coated with the metal mounted thereon are also shown. It was ensured from this evaluation result that coating the side surface of the chip carrier results in an improvement of the optical response characteristics by approximately 10 GHz.

As described above, according to this embodiment, simply coating the side surface of inexpensive conventional chip carrier constituted of the dielectric material or semiconductor substrate with the metal can obtain the excellent frequency characteristics without the abrupt deterioration in the characteristics, and it is possible to provide the chip carrier which is inexpensive, has easy operating steps and is superior in frequency characteristics, the optical module using this chip carrier, and the transceiver.

It is noted that the description has been given as to the case using the external modulator integrated laser as the optical semiconductor device in this embodiment, the same effect can also be expected even if the direct-modulated laser having no external modulator is used. In this case, the side surface closest to the position of chip carrier on which the directed-modulated laser is mounted is coated with the metal.

The present invention is not restricted to shapes or properties of constituent components on the chip carrier. For example, although the high-frequency transmission line is a micro-strip line in this embodiment, the respective similar effects can be demonstrated in case of a line (generally, a line of 50 Ω) which does not attenuate a high-frequency signal such as a coplanar line or a grounded coplanar line (coplanar line having a rear surface of the substrate coated with a metal).

Embodiment 2

Figure 8:
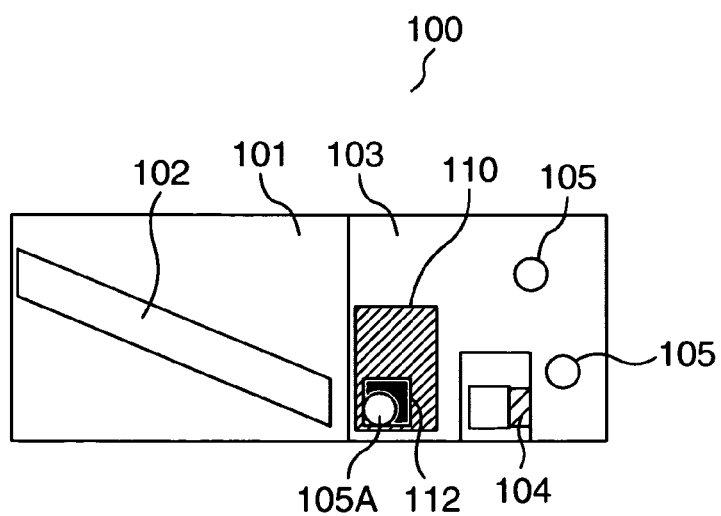
FIG. 8 is a plane view illustrating a chip carrier structure according to the present invention.

It has been apparent from the foregoing embodiment that reducing an inductance of the chip carrier is important in order to improve the high-frequency characteristics of the chip carrier. Here, there can be considered the reduction of distance between the modulator 112 of the external modulator integrated laser 110 mounted on the chip carrier and the via-hole of the chip carrier as another means for reducing the inductance. In order to reduce this distance to the minimum level, it is good enough to arrange the via-hole 105A directly below the modulator 112 as shown in FIG. 8. Reference numerals excluding the via-hole 105A denote structures identical to those described in conjunction with FIG. 1A.

Figure 9:
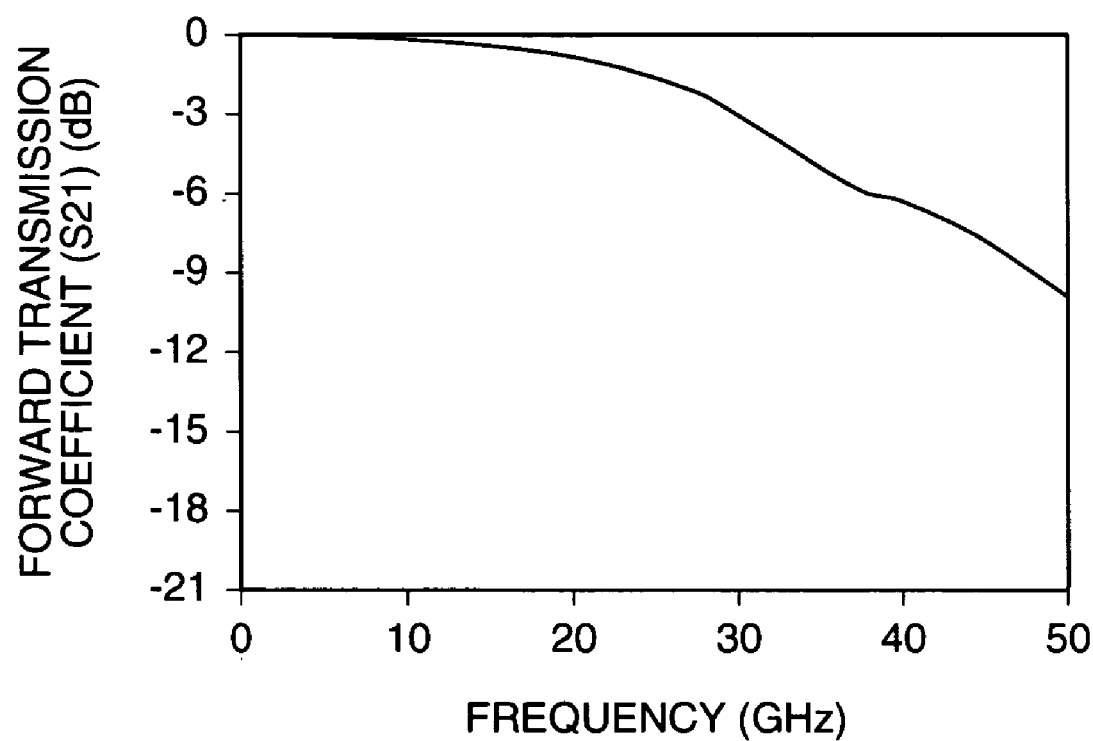
FIG. 9 is a diagram illustrating characteristics obtained by the chip carrier according to the present invention.

FIG. 9 shows a simulation result of frequency characteristics when the via-hole 105A is arranged directly below the modulator 112 depicted in FIG. 8. As compared with the example in which the side surface of chip carrier is coated with the metal described in conjunction with the first embodiment, it is apparent that the excellent characteristics that a resonance does not occur in a high-frequency domain can be obtained.

However, the flatness of a via-hole portion and the dielectric material or the semiconductor substrate around this portion may be deteriorated which results in reducing adhesive property at the time of soldering the device by arranging the via-hole directly below the device in some cases. Additionally, there is possibility that stress may be applied to the optical semiconductor device due to a different thermal expansion coefficient between the via-hole portion and the substrate and thereby the reliability of the device may not be guaranteed. Therefore, a countermeasure against these deteriorations, e.g., reinforcement of soldering is additionally applied according to needs.

As described above, according to this embodiment, in the inexpensive conventional chip carrier comprising the dielectric material or semiconductor substrate, since the excellent frequency characteristics without the abrupt deterioration or resonance in characteristics can be obtained by simply changing the position of via-hole thereof, it is possible to provide a chip carrier which is inexpensive, has easy operating steps and is superior in frequency characteristics, the optical module using this chip carrier, and the optical transceiver. This embodiment is not restricted to shapes or properties of constituent components on the chip carrier like the first embodiment.

Moreover, a further improvement in the high-frequency characteristics can be expected by conformation in which the first embodiment is combined with this embodiment, i.e., coating the side surface of chip carrier with the metal and providing the via-hole directly below the optical semiconductor device which is operated with a high frequency.

It is noted that the description has been given as to the example in which the external modulator integrated laser is used as the optical semiconductor device in this embodiment, but the same effect can be expected even if a direct-modulated laser having no external modulator is used. In such a case, the via-hole is arranged directly below a position of the chip carrier at which the direct-modulated laser is mounted.

Although a light emitting device has been described in both the first embodiment and the second embodiment, the present invention is not restricted thereto, and it is also effective to a chip carrier of a detector such as a photo diode (PD) or an avalanche photo diode (APD), an optical module using this chip carrier, and a PD receiver.

It is also effective to an optical transceiver which both the LD module and the PD module mentioned above are incorporated in the same package.

Further, the chip carrier according to the present invention is not restricted to the optical semiconductor device. An improvement in high-frequency characteristics can be expected by using the chip carrier according to the present invention as long as it is a device in which a factor deteriorating high-frequency characteristics is caused by a parasite capacitance of the device, i.e., a capacitive device having a capacitor structure such as a transistor.

It should be further understood by those skilled in the art that although the foregoing description has been made on embodiments of the invention, the invention is not limited thereto and various changes and modifications may be made without departing from the spirit of the invention and the scope of the appended claims.

What is claimed is:

1. A chip carrier including a dielectric or semiconductor substrate, one surface of which includes a metal-coated portion and an opposite surface of which includes a metal-coated portion, a high frequency transmission line is arranged on said one surface of the substrate and a semiconductor device is mounted on said metal-coated portion formed on said one surface of the substrate, wherein
said metal-coated portion of said one surface is connected with said metal-coated portion of said opposite surface through a metal-coated portion formed on a side surface of said substrate.

2. The chip carrier according to claim 1, wherein the metal-coated portion on the one surface of the substrate is connected with the metal-coated portion on the opposite surface by a metallic via-hole formed on passing through the substrate.

3. The chip carrier according to claim 1, wherein the metal-coated portion formed on the side surface of the substrate is formed on the side surface closest to a position at which the optical semiconductor device is mounted.

4. The chip carrier according to claim 3, wherein an area of the metal-coated portion formed on the side surface of the substrate is equal to or greater than ⅓ of the side surface.

* * * * *